United States Patent
Schwarzenbach et al.

(10) Patent No.: US 10,672,646 B2
(45) Date of Patent: Jun. 2, 2020

(54) METHOD FOR FABRICATING A STRAINED SEMICONDUCTOR-ON-INSULATOR SUBSTRATE

(71) Applicant: Soitec, Bernin (FR)

(72) Inventors: Walter Schwarzenbach, Saint Nazaire les Eymes (FR); Guillaume Chabanne, Le Touvet (FR); Nicolas Daval, Goncelin (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 16/301,260

(22) PCT Filed: May 17, 2017

(86) PCT No.: PCT/EP2017/061792
§ 371 (c)(1),
(2) Date: Nov. 13, 2018

(87) PCT Pub. No.: WO2017/198686
PCT Pub. Date: Nov. 23, 2017

(65) Prior Publication Data
US 2019/0181035 A1 Jun. 13, 2019

(30) Foreign Application Priority Data
May 17, 2016 (FR) ..................... 16 54368

(51) Int. Cl.
*H01L 27/12* (2006.01)
*H01L 21/762* (2006.01)

(52) U.S. Cl.
CPC .... *H01L 21/76254* (2013.01); *H01L 27/1203* (2013.01)

(58) Field of Classification Search
CPC .......................... H01L 21/84; H01L 27/1203
See application file for complete search history.

(56) References Cited

U.S. PATENT DOCUMENTS

| 2006/0081847 A1 | 4/2006 | Le Vaillant |
| 2007/0164356 A1* | 7/2007 | Adam ............... H01L 21/76243 257/347 |

(Continued)

FOREIGN PATENT DOCUMENTS

FR 2912550 A1 8/2008

OTHER PUBLICATIONS

International Written Opinion for International Application No. PCT/EP2017/061792 dated Aug. 25, 2017, 6 pages.

(Continued)

*Primary Examiner* — Thomas L Dickey
(74) *Attorney, Agent, or Firm* — TraskBritt

(57) ABSTRACT

A method for fabricating a strained semiconductor-on-insulator substrate includes bonding a donor substrate to a receiving substrate, with a dielectric layer at the interface, and transferring a monocrystalline semiconductor layer from the donor substrate to the receiving substrate. A portion is cut from a stack formed from the transferred monocrystalline semiconductor layer from the dielectric layer and from the strained semiconductor material layer. The cutting results in the relaxation of the strain in the strained semiconductor material, and in the application of at least a part of the strain to the transferred monocrystalline semiconductor layer. The method also involves the formation, on the strained semiconductor material layer of the receiving substrate, of a dielectric bonding layer or of a bonding layer consisting of the same relaxed, or at least partially relaxed, monocrystalline material as the monocrystalline semiconductor layer of the donor substrate.

19 Claims, 8 Drawing Sheets

(56) References Cited

U.S. PATENT DOCUMENTS

2009/0179226 A1    7/2009  Teo et al.
2014/0225160 A1    8/2014  Clifton et al.

OTHER PUBLICATIONS

International Search Report for International Application No. PCT/EP2017/061792 dated Aug. 25, 2017, 3 pages.

* cited by examiner

METHOD FOR FABRICATING A STRAINED SEMICONDUCTOR-ON-INSULATOR SUBSTRATE

CROSS-REFERENCE TO RELATED APPLICATIONS

This application is a national phase entry under 35 U.S.C. § 371 of International Patent Application PCT/EP2017/061792, filed May 17, 2017, designating the United States of America and published in English as International Patent Publication WO 2017/198686 A1 on Nov. 23, 2017, which claims the benefit under Article 8 of the Patent Cooperation Treaty to French Patent Application Serial No. 1654368, filed May 17, 2016.

TECHNICAL FIELD

The present disclosure relates to a method for fabricating a strained semiconductor-on-insulator substrate, as well as such a substrate.

BACKGROUND

For digital applications, in particular, for technological nodes beyond the 22 nm node, materials with enhanced charge carrier mobility are sought.

Among these materials, FDSOI (acronym for fully depleted silicon-on-insulator) substrates feature a very thin (i.e., typically less than 50 nm thick) layer of silicon on a buried electrically insulating layer, the silicon layer potentially being used to form the channel of a CMOS transistor.

Strained silicon-on-insulator (sSOI) has been identified as a solution allowing the mobility of charge carriers in the silicon layer to be enhanced and good performance thereof has been demonstrated.

Various fabrication methods are known.

Document US 2014/0225160 discloses, in particular, a method allowing at least part of a strain present in a silicon-germanium layer located on the surface of a receiving substrate to be transferred to an initially relaxed silicon layer bonded to the receiving substrate via a dielectric layer that is intended to form the buried insulating layer of the SOI. This strain transfer occurs when a portion of the stack is cut by means of trenches that extend into the receiving substrate at least beyond the strained silicon-germanium layer. Thus, a relaxation of the compressive strain of the silicon-germanium layer is at least partially transmitted in the form of a tensile strain of the silicon layer.

Based on this principle, an sSOI substrate can be manufactured according to the following steps:
- a donor substrate 1 comprising a monocrystalline carrier substrate 10 covered by a silicon oxide or dielectric layer 11 is provided (cf. FIG. 1A);
- ionic species are implanted into the donor substrate 1 so as to form a weakened zone 12 allowing a monocrystalline semiconductor layer 13 to be transferred to be defined (cf. FIG. 1B);
- a receiving substrate 2 comprising a surface layer 20 of silicon-germanium under compressive strain is provided (cf. FIG. 1C);
- the donor substrate 1 is bonded to the receiving substrate 2, the silicon oxide (or dielectric) layer 11 which is intended to form the buried insulating layer of the sSOI substrate and the strained silicon-germanium layer 20 being at the bonding interface (cf. FIG. 1D);
- the monocrystalline silicon layer 13 is transferred to the receiving substrate 2 by detaching the donor substrate along the weakened zone (cf. FIG. 1E);
- trenches T are formed around a portion of the stack consisting of the strained silicon-germanium layer 20, the buried oxide (or dielectric) layer 11 and the transferred monocrystalline semiconductor layer 13, the trenches extending into the receiving substrate 2 beyond the strained silicon-germanium layer 20 (cf. FIG. 1F).

The cutting operation results in the at least partial relaxation of the silicon-germanium and the transmission of at least part of the strain to the transferred silicon layer in the portion, thus allowing the strained semiconductor-on-insulator substrate, denoted by sSOI, to be formed.

For applications beyond the 22 nm technological node, the thickness of the buried dielectric layer should be less than or equal to 25 nm.

For such a low thickness of the dielectric layer, the final defectivity of the sSOI substrate heavily depends on the bonding conditions and, in particular, on the materials present at the bonding interface.

However, although surface preparation treatments that are conventionally used in the field of semiconductors are applied to the silicon-germanium layer, a substantial degree of defectivity of the sSOI substrate is still observed.

BRIEF SUMMARY

One aim of the present disclosure is to design a method for fabricating a strained semiconductor-on-insulator substrate that makes it possible to decrease the defectivity of the substrate linked to the conditions of bonding the donor substrate to the receiving layer.

According to one embodiment, a method for fabricating a strained semiconductor-on-insulator substrate comprises:
(a) providing a donor substrate comprising a monocrystalline semiconductor layer;
(b) providing a receiving substrate comprising a surface layer of a strained monocrystalline semiconductor material;
(c) bonding the donor substrate to the receiving substrate, a dielectric layer being at the interface;
(d) transferring the monocrystalline semiconductor layer from the donor substrate to the receiving substrate; and
(e) cutting a portion from a stack formed from the transferred monocrystalline semiconductor layer, from the dielectric layer and from the strained semiconductor material layer, the cutting operation resulting in the relaxation of the strain in the strained semiconductor material, and in the application of at least a part of the strain to the transferred monocrystalline semiconductor layer;

the method being characterized in that step (b) further comprises the formation, on the strained semiconductor material layer of the receiving substrate, of a dielectric bonding layer or of a bonding layer consisting of the same relaxed, or at least partially relaxed, monocrystalline material as the monocrystalline semiconductor layer of the donor substrate, and in that in step (c) the bonding layer is at the bonding interface between the donor substrate and the receiving substrate.

The present text is concerned with the strain in a plane parallel to the main surface of the layers in question.

The bonding layer formed on the receiving substrate allows materials providing optimum bonding quality in terms of final defectivity to be brought into contact at the bonding interface.

According to other advantageous features of the disclosure, taken alone or in combination as appropriate:

- according to one embodiment, the bonding layer is formed by deposition of a dielectric material on the strained semiconductor material layer of the receiving substrate;
- the donor substrate comprises a first dielectric layer on the monocrystalline semiconductor layer, the first dielectric layer and the bonding layer together forming a buried electrically insulating layer of the strained semiconductor-on-insulator substrate;
- the bonding layer comprises an oxide or a nitride of a semiconductor material;
- the thickness of the bonding layer is between 1 nm and 30 nm;
- according to another embodiment, the bonding layer is formed by epitaxy, on the strained semiconductor material layer, of the same semiconductor material as the monocrystalline semiconductor layer of the donor substrate;
- the thickness of the bonding layer is between 1 nm and 20 nm;
- the bonding layer and the monocrystalline semiconductor layer of the donor substrate are made of silicon;
- the strained semiconductor material layer is made of silicon-germanium;
- the strained semiconductor layer is formed by epitaxy on a silicon carrier substrate;
- upon completion of step (d), the thickness of the dielectric layer included between the transferred monocrystalline semiconductor layer and the strained semiconductor material layer is less than or equal to 50 nm, preferably less than or equal to 25 nm;
- step (a) comprises an operation of implanting ionic species into the donor substrate so as to form a weakened zone defining the monocrystalline semiconductor layer, and step (d) comprises the detachment of the donor substrate along the weakened zone.
- step (d) comprises an operation of thinning the donor substrate on the face opposite the bonding interface up to the transferred monocrystalline semiconductor layer;
- the method additionally comprises, before step (e), a step of thinning and/or smoothing the transferred monocrystalline semiconductor layer;
- the operation of cutting the portion of the stack is carried out by means of trench isolations extending into the receiving substrate beyond the strained semiconductor material layer.

Another aim of the disclosure relates to a strained semiconductor-on-insulator substrate obtained by means of a method such as described above.

The substrate comprises, in succession, a strained monocrystalline semiconductor layer, an electrically insulating layer, an at least partially relaxed layer of the same material as the strained semiconductor layer, and a relaxed layer of a semiconductor material that differs from that of the strained semiconductor layer.

Advantageously, the thickness of the electrically insulating layer is less than or equal to 50 nm, preferably less than or equal to 25 nm, and the thickness of the at least partially relaxed layer of the same material as the strained semiconductor layer is between 1 nm and 20 nm.

BRIEF DESCRIPTION OF THE DRAWINGS

Other features and advantages of the disclosure will emerge from the detailed description that follows, with reference to the accompanying drawings in which.

Figure 1A:
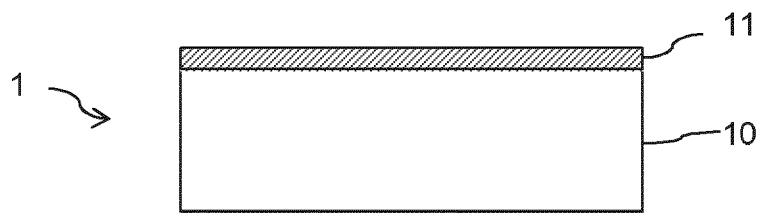
FIGS. 1A to 1F schematically illustrate steps of a method for fabricating a strained silicon-on-insulator substrate leading to overly high defectivity.
Figure 1B:
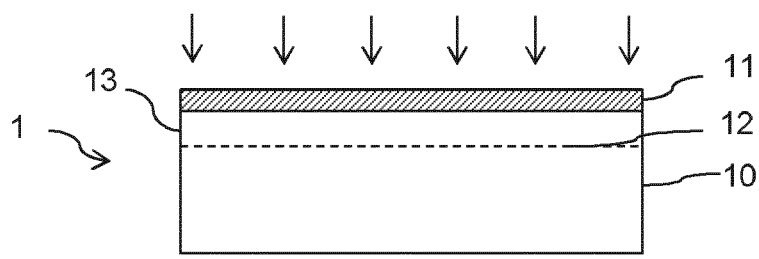
Figure 1C:
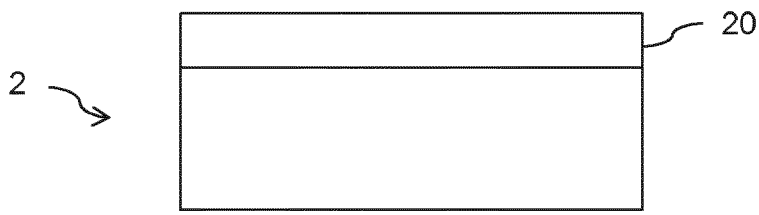
Figure 1D:
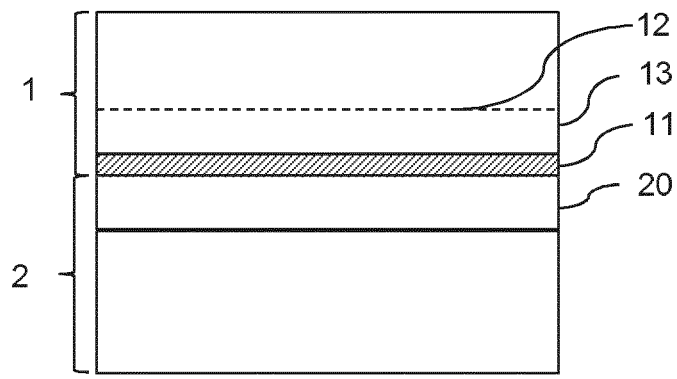
Figure 1E:
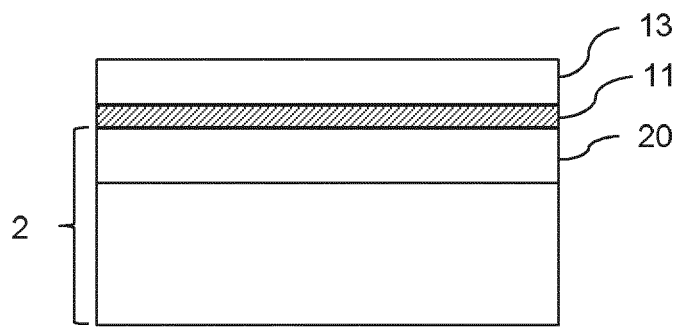
Figure 1F:
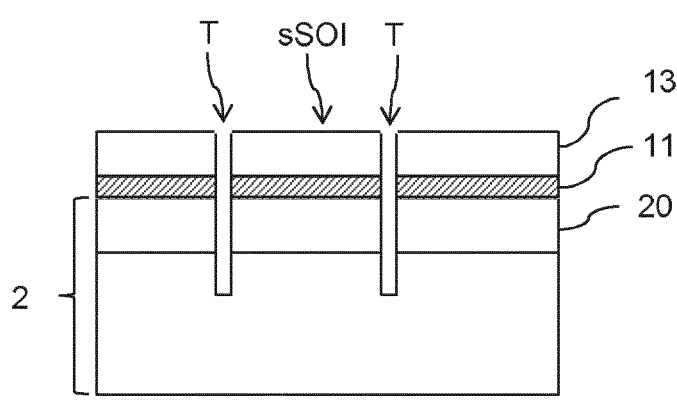

In order to facilitate the readability of the figures, the various layers are not shown to scale.

DETAILED DESCRIPTION

A donor substrate is provided that comprises at least one monocrystalline semiconductor layer. The substrate may be a bulk semiconductor substrate or a composite substrate, i.e., that consists of at least two layers of different materials including the monocrystalline semiconductor layer, which is arranged on the surface of the substrate.

The material of the monocrystalline semiconductor layer may be, in particular, silicon, germanium or silicon-germanium.

At this stage in the method, the monocrystalline semiconductor layer is in the relaxed state.

According to one embodiment, the monocrystalline semiconductor layer is covered by a dielectric layer. The dielectric layer may be, in particular, a layer of an oxide or of a nitride of a semiconductor material.

For example, if the monocrystalline layer is a silicon layer, the dielectric layer may be a silicon oxide ($SiO_2$) layer.

The dielectric layer will form all or part of the buried insulating layer of the strained semiconductor-on-insulator substrate.

Alternatively, the monocrystalline semiconductor layer is not covered by such a dielectric layer and it is the free surface thereof that forms the surface of the donor substrate.

A receiving substrate that comprises a surface layer of a strained semiconductor material is also provided. The layer may be formed by epitaxy on a carrier substrate having a lattice parameter that differs from that of the material of the strained layer.

The strain in this layer may be, depending on the materials used and on the nature of the strain to which it is desired to subject the semiconductor layer of the strained semiconductor-on-insulator substrate, compressive or tensile.

For example, the strained semiconductor material layer may be a silicon-germanium layer, formed by epitaxy on a silicon carrier substrate. The germanium content of the layer is typically of the order of 20% to 40%, although these values are not limiting, the choice thereof potentially being made according to the thickness of the layer. In this case, the strain in the silicon-germanium layer is compressive.

In order to form the strained semiconductor-on-insulator substrate, the monocrystalline semiconductor layer of the donor substrate should be transferred to the receiver substrate, this transfer comprising an operation of bonding the donor substrate to the receiver substrate, the monocrystalline semiconductor layer of the donor substrate and the strained semiconductor material layer being located on the bonding interface side.

A bonding layer is formed beforehand on the strained semiconductor material layer of the receiving substrate, which bonding layer allows materials providing optimum bonding quality in terms of final defectivity to be brought into contact at the bonding interface.

According to one embodiment, the bonding layer is a dielectric layer.

In the case in which the monocrystalline semiconductor layer of the donor substrate is also covered by a dielectric layer (referred to as the first dielectric layer), the bonding interface will consist of the first dielectric layer and of the bonding layer (referred to as the second dielectric layer). The first and second dielectric layers thus together form the buried insulating layer of the final sSOI.

In the case in which the monocrystalline semiconductor layer of the donor substrate is not covered by a dielectric layer, the bonding interface will consist of the monocrystalline semiconductor layer and of the bonding layer. It is then the bonding layer alone that forms the buried insulating layer of the final sSOI.

Advantageously, the bonding layer comprises an oxide or a nitride of a semiconductor material.

The bonding layer is formed by deposition on the strained semiconductor material layer of the receiving substrate. Any suitable deposition technique may be used. In a non-limiting manner, the vapor phase deposition variants known by the acronyms PE-CVD or PE-ALD may thus be cited.

The thickness of the bonding layer is chosen according to whether a first dielectric layer is present on the monocrystalline semiconductor layer of the donor substrate so as to obtain the desired thickness of the buried insulating layer, which is generally less than or equal to 50 nm, preferably less than or equal to 25 nm.

Advantageously, the thickness is also chosen while taking the thermal budget applied to the receiving substrate during the deposition of the layer into consideration, in order to limit the relaxation of the strain in the strained semiconductor material layer caused by this thermal budget. Thus, for example, if the strained semiconductor material layer is a silicon-germanium layer, the germanium is liable to diffuse out of the layer under the effect of a high thermal budget, thereby decreasing the strain in the layer. The thermal budget should, therefore, be limited in order to avoid a substantial decrease in the strain and thus retain the strain that will be imparted to the monocrystalline semiconductor layer of the sSOI substrate.

The thickness of the bonding layer is typically between 1 nm and 30 nm.

According to another embodiment, the bonding layer consists of the same monocrystalline material, in the relaxed or partially relaxed state, as the monocrystalline semiconductor layer of the donor substrate.

In this case, the monocrystalline semiconductor layer is covered by a dielectric layer that will form the buried insulating layer of the sSOI substrate.

The bonding layer is formed by epitaxy on the strained semiconductor material layer, of the same semiconductor material as the monocrystalline semiconductor layer of the donor substrate.

The thickness of the bonding layer is advantageously chosen so that it is thin enough to offer the desired level of protection between the SiGe layer and the bonding interface, while taking, as in the preceding embodiment, the thermal budget applied to the receiving substrate during the deposition of the layer into consideration, in order to limit the relaxation of the strain in the strained semiconductor material layer caused by this thermal budget. The thickness also takes into account the removal of material caused by the pre-bonding surface preparation treatment, which may include wet or dry etching.

By way of example, the thickness of such a silicon bonding layer is between 1 nm and 20 nm.

In the two embodiments proposed by the disclosure, the bonding interface makes either contact between two dielectric layers or contact between a dielectric layer and a layer of the same monocrystalline material, in the relaxed or partially relaxed state, as the monocrystalline semiconductor layer of the donor substrate. These two situations correspond to the bonding configurations that provide minimum final defectivity.

After bonding the donor substrate to the receiving substrate, the monocrystalline semiconductor layer is transferred to the receiving substrate.

According to one embodiment, the transfer involves the SMART CUT® method. In a manner known per se, this transfer comprises:
  prior to the bonding operation, ionic species are implanted into the donor substrate so as to form a weakened zone allowing the monocrystalline semiconductor layer to be transferred to be defined;
  after the bonding operation, the donor substrate is detached along the weakened zone.

The conditions of implementation of such a method are known to those skilled in the art and, as such, will not be described in detail in the present text.

According to another embodiment, the transfer involves thinning the donor substrate on its back face, i.e., the face opposite the bonding interface. As is well known, such a thinning operation may involve one or more steps of dry or wet etching and/or polishing, especially chemical-mechanical polishing, etc.

The disclosure is not limited with respect to the transfer technique used.

After the transfer itself, the transferred semiconductor layer can undergo a finishing treatment allowing residual defects linked to the transfer process to be removed and the transferred monocrystalline semiconductor layer to be smoothed and thinned to the desired thickness. This type of treatment is known to those skilled in the art and, as such, will not be described in detail here. Typically, the final thickness of the monocrystalline semiconductor layer of the sSOI substrate is between 5 nm and 50 nm.

Lastly, a portion of the stack consisting of the transferred semiconductor layer, of the buried insulating layer (which is formed, as disclosed above, from the bonding layer and/or from a dielectric layer of the donor substrate) and of the strained semiconductor material layer is cut in order to form the sSOI substrate.

The cutting operation is advantageously carried out by etching trench isolations around the portion. In order to allow the relaxation of the strained semiconductor material layer to be optimally transmitted to the transferred monocrystalline semiconductor layer, the trenches should extend into the thickness of the receiving substrate beyond the strained semiconductor material layer. The technique for fabricating the trenches is well known to those skilled in the art and, as such, does not need to be described in detail in the present text.

The resulting structure comprises, from its base to its surface, the carrier substrate, the initially strained semiconductor material layer, which is now in the relaxed state, the buried insulating layer and the transferred semiconductor monocrystalline layer, which is now in the strained state. If the bonding layer is made of a dielectric material, it forms at least part (or even all) of the buried insulating layer. If the bonding layer is made of the same material, in the relaxed or partially relaxed state, as the transferred semiconductor layer, the bonding layer is intercalated between the initially strained semiconductor material layer, which is now in the relaxed state, and the buried insulating layer.

With respect to an sSOI substrate obtained via the method illustrated in FIGS. 1A to 1F with the same cleaning, donor substrate preparation and bonding conditions, an sSOI substrate obtained according to the method described above exhibits, upon visual inspection, a much lower degree of defectivity, which results, in particular, in a substantial decrease in the number of holes corresponding to non-transferred zones of the monocrystalline semiconductor layer.

FIGS. 2A to 2G schematically illustrate steps of the fabrication of a strained semiconductor-on-insulator substrate according to one form of execution of the disclosure.

Figure 2A:
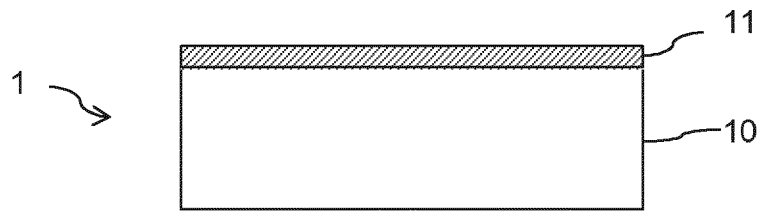
FIGS. 2A to 2G schematically illustrate steps of a method for fabricating a strained semiconductor-on-insulator substrate according to a first embodiment of the disclosure.

FIG. 2A illustrates the provision of the donor substrate 1 that, in this illustration, is a bulk substrate of a monocrystalline semiconductor material. Alternatively, the substrate could be a composite and comprise, on one of its faces, a monocrystalline semiconductor layer.

Furthermore, in the embodiment illustrated in FIG. 2A, the donor substrate 1 is covered by a dielectric layer 11.

Figure 2B:
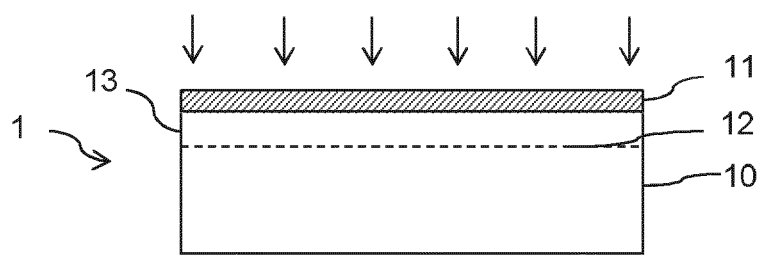

FIG. 2B illustrates the implementation of an implantation of ionic species into the donor substrate 1 so as to form a weakened zone 12 defining a monocrystalline semiconductor layer 13 to be transferred by means of the SMART CUT® method. This step is optional, the transfer potentially being carried out by means of a method other than the SMART CUT® method, for example, by thinning the donor substrate on its back face.

Figure 2C:
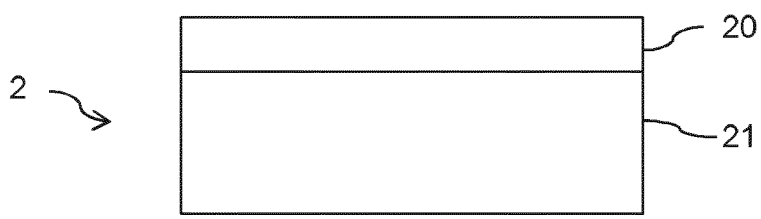

FIG. 2C illustrates the provision of the receiving substrate 2 that comprises a surface layer 20 of a strained monocrystalline semiconductor material on a carrier substrate 21.

Figure 2D:
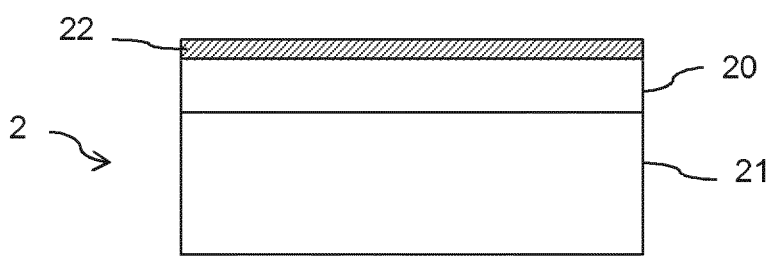

FIG. 2D illustrates the formation of the dielectric bonding layer 22 that, in this case, consists of a dielectric material deposited on the strained monocrystalline semiconductor material layer 20.

Figure 2E:
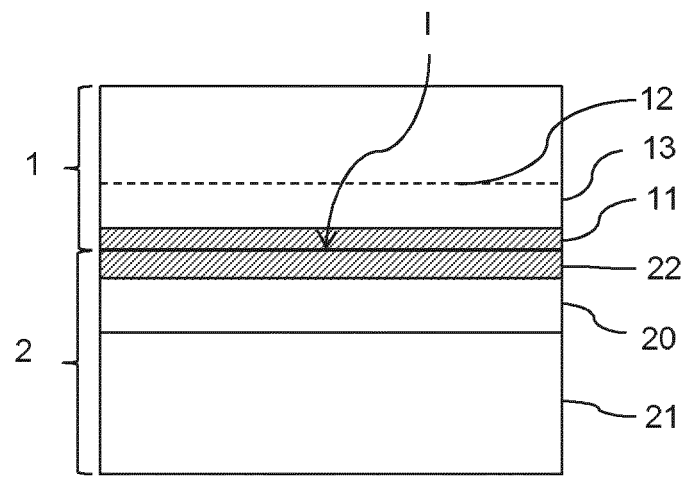

FIG. 2E illustrates the bonding of the donor substrate to the receiving substrate, the dielectric layers 11 and 22 together forming the buried insulating layer (referred to as a single layer 30 in the following figures) of the final strained semiconductor-on-insulator substrate. The bonding interface is denoted by the reference I.

Figure 2F:
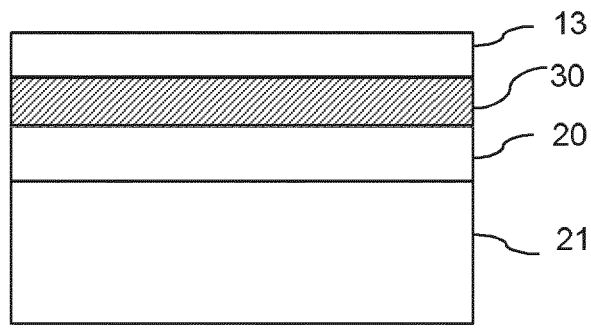

FIG. 2F illustrates the structure obtained after detaching the donor substrate along the weakened zone and, if applicable, after the transferred monocrystalline semiconductor layer 13 has undergone the finishing treatment. Alternatively, if the SMART CUT® method is not used, the structure may be obtained by thinning the back face of the donor substrate up to the monocrystalline semiconductor layer 13 and smoothing the surface of the layer.

Figure 2G:
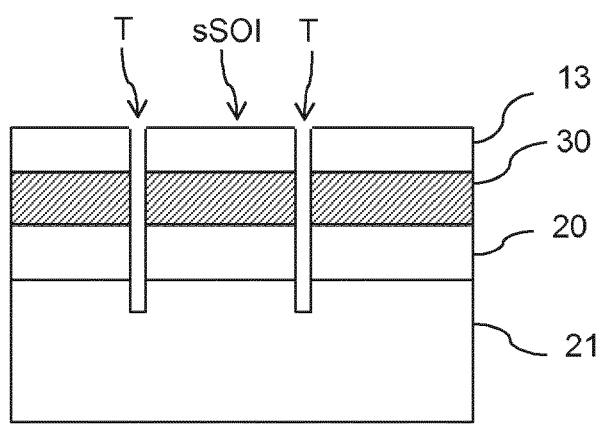

FIG. 2G illustrates the sSOI substrate obtained after cutting trenches T around the stack of layers 13, 30, 20 up to within the thickness of the carrier substrate 21.

FIGS. 3A to 3G schematically illustrate steps of the fabrication of a strained semiconductor-on-insulator substrate according to another form of execution of the disclosure.

The elements denoted by the same references as in FIGS. 2A to 2G are of the same nature and as such are not described again.

Figure 3A:
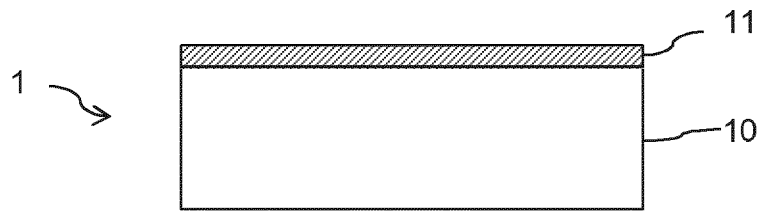
FIGS. 3A to 3G schematically illustrate steps of a method for fabricating a strained semiconductor-on-insulator substrate according to a second embodiment of the disclosure.
Figure 3B:
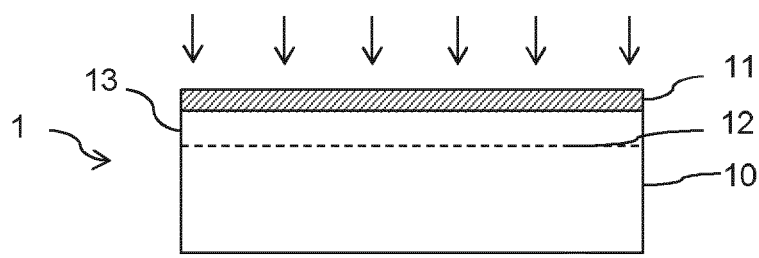
Figure 3C:
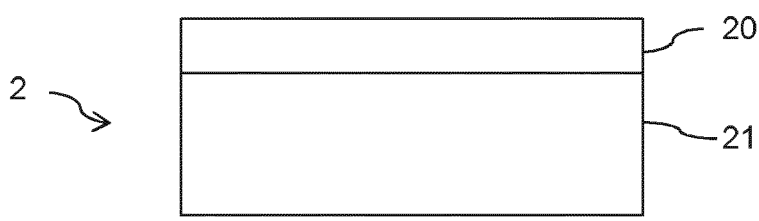

The steps illustrated in FIGS. 3A to 3C are similar to those of FIGS. 2A to 2C.

Figure 3D:
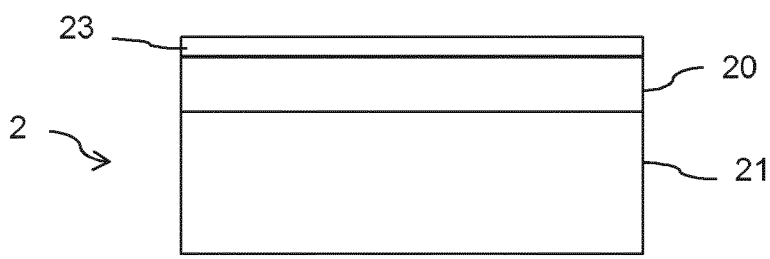

FIG. 3D illustrates the formation of a bonding layer 23 that, in this case, consists of the same material as that of the monocrystalline semiconductor layer 13, in the relaxed or partially relaxed state, by epitaxy on the strained monocrystalline semiconductor material layer 20.

Figure 3E:
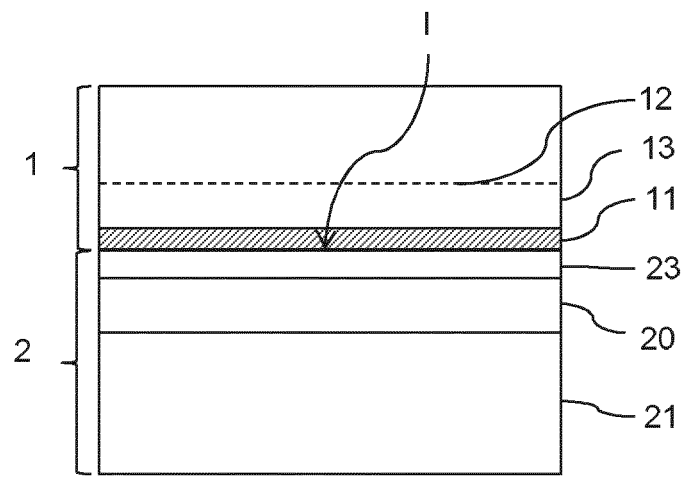
Figure 3F:
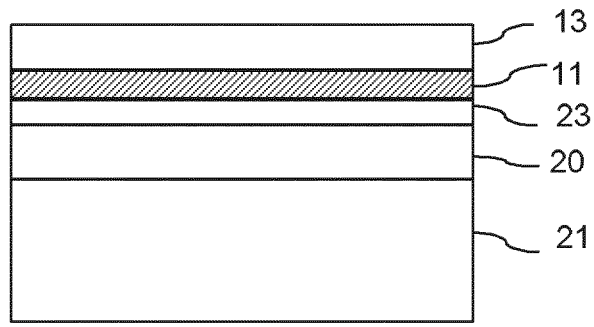
Figure 3G:
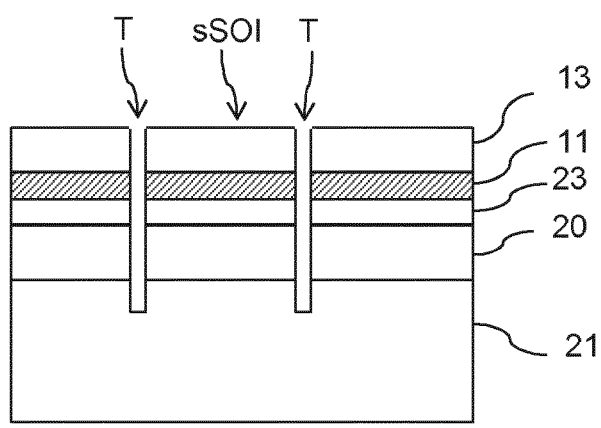

The steps illustrated in FIGS. 3E to 3G are similar to those of FIGS. 2E to 2G, except in that the buried insulating layer of the sSOI substrate consists of the single dielectric layer 11 of the donor substrate, and that the bonding layer 23 is intercalated between the strained monocrystalline semiconductor material layer 20 and the buried insulating layer.

FIGS. 4A to 4G schematically illustrate steps of the fabrication of a strained semiconductor-on-insulator substrate according to another form of execution of the disclosure.

The elements denoted by the same references as in FIG. 2A to 2G or 3A to 3G are of the same nature and as such are not described again.

Figure 4A:
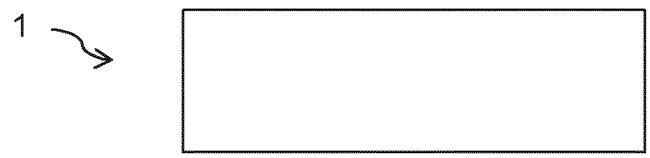
FIGS. 4A to 4G schematically illustrate steps of a method for fabricating a strained semiconductor-on-insulator substrate according to a third embodiment of the disclosure.
Figure 4B:
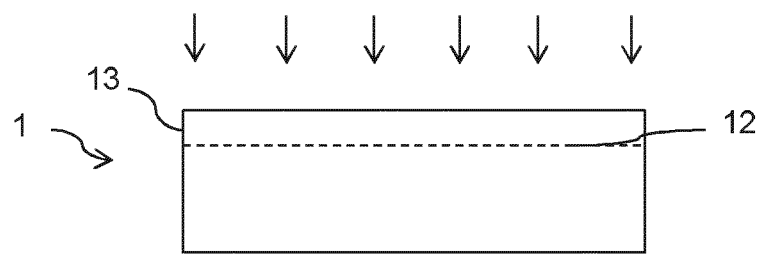
Figure 4C:
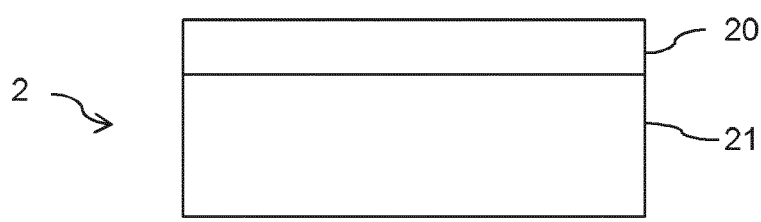

The steps illustrated in FIGS. 4A to 4C are similar to those of FIGS. 2A to 2C, except in that the donor substrate 1 is not covered by a dielectric layer. Stated otherwise, it is the semiconductor surface of the monocrystalline semiconductor layer 13 to be transferred that is exposed.

Figure 4D:
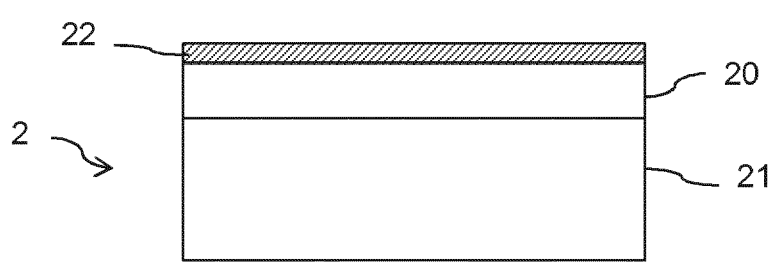

FIG. 4D illustrates the formation of a dielectric bonding layer 22 that, in this case, consists of a dielectric material deposited on the strained monocrystalline semiconductor material layer 20.

Figure 4E:
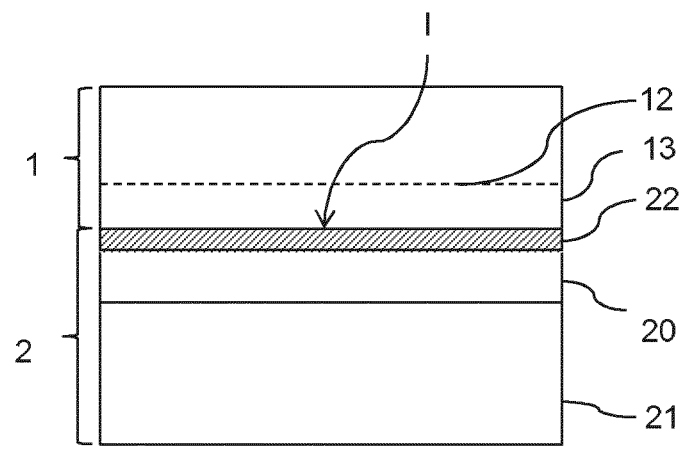
Figure 4F:
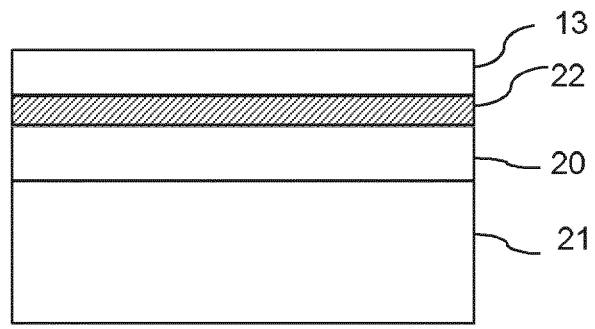
Figure 4G:
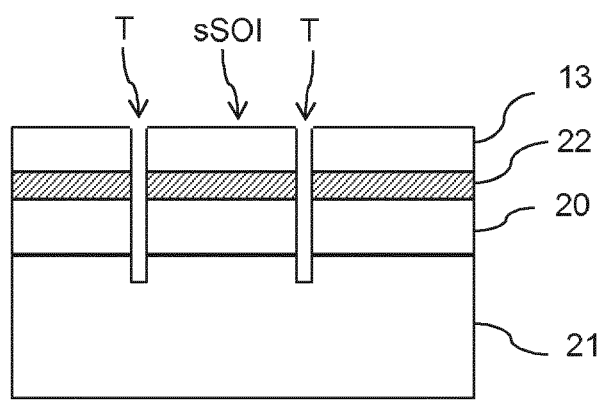

The steps illustrated in FIGS. 4E to 4G are similar to those of FIGS. 2E to 2G, except in that the buried insulating layer of the sSOI substrate consists of the single dielectric bonding layer 22.

Lastly, it goes without saying that the examples given above are only particular illustrations that are in no way limiting with respect to the fields of application of the disclosure.

The invention claimed is:

1. A method for fabricating a strained semiconductor-on-insulator substrate, the method comprising:
    (a) providing a donor substrate comprising a monocrystalline semiconductor layer;
    (b) providing a receiving substrate comprising a surface layer of a strained monocrystalline semiconductor material;
    (c) bonding of the donor substrate to the receiving substrate, a dielectric layer being at the interface;
    (d) transfer of the monocrystalline semiconductor layer from the donor substrate to the receiving substrate; and
    (e) cutting a portion from a stack formed from the transferred monocrystalline semiconductor layer, from the dielectric layer and from the strained monocrystalline semiconductor material layer, the cutting operation resulting in relaxation of the strain in the strained semiconductor material, and in application of at least a part of the strain to the transferred monocrystalline semiconductor layer;
    wherein step (b) additionally comprises the formation, on the strained monocrystalline semiconductor material layer of the receiving substrate, of a dielectric bonding layer or of a bonding layer consisting of the same relaxed, or at least partially relaxed, monocrystalline material as the monocrystalline semiconductor layer of the donor substrate, and wherein, in step (c), the bonding layer is at the bonding interface between the donor substrate and the receiving substrate.

2. The method of claim 1, wherein the bonding layer is formed by deposition of a dielectric material on the strained monocrystalline semiconductor material layer of the receiving substrate.

3. The method of claim 2, wherein the donor substrate comprises a first dielectric layer on the monocrystalline semiconductor layer, the first dielectric layer and the bonding layer together forming a buried electrically insulating layer of the strained semiconductor-on-insulator substrate.

4. The method of claim 2, wherein the bonding layer comprises an oxide or a nitride of a semiconductor material.

5. The method of claim 2, wherein a thickness of the bonding layer is between 1 nm and 30 nm.

6. The method of claim 1, wherein the bonding layer is formed by epitaxy, on the strained monocrystalline semiconductor material layer, of the same semiconductor material as the monocrystalline semiconductor layer of the donor substrate.

7. The method of claim 6, wherein a thickness of the bonding layer is between 1 nm and 20 nm.

8. The method of claim 6, wherein the bonding layer and the monocrystalline semiconductor layer of the donor substrate are made of silicon.

9. The method of claim 1, wherein the strained monocrystalline semiconductor material layer is made of silicon-germanium.

10. The method of claim 9, wherein the strained monocrystalline semiconductor material layer is formed by epitaxy on a silicon carrier substrate.

11. The method of claim 1, wherein, upon completion of step (d), a thickness of the dielectric layer included between the transferred monocrystalline semiconductor layer and the strained monocrystalline semiconductor material layer is less than or equal to 50 nm.

12. The method of claim 11, wherein the strained monocrystalline semiconductor material layer is less than or equal to 25 nm.

13. The method of claim 1, wherein step (a) comprises an operation of implanting ionic species into the donor substrate so as to form a weakened zone defining the monocrystalline semiconductor layer, and step (d) comprises the detachment of the donor substrate along the weakened zone.

14. The method of claim 1, wherein step (d) comprises an operation of thinning the donor substrate on the face opposite the bonding interface up to the transferred monocrystalline semiconductor layer.

15. The method of claim 1, further comprising, before step (e), a step of thinning and/or smoothing the transferred monocrystalline semiconductor layer.

16. The method of claim 1, wherein the operation of cutting the portion of the stack is carried out by way of trench isolations extending into the receiving substrate beyond the strained monocrystalline semiconductor material layer.

17. A strained semiconductor-on-insulator substrate, comprising successively: a strained monocrystalline semiconductor layer, an electrically insulating layer, an at least partially relaxed layer of the same material as the strained semiconductor layer, and a relaxed layer of a semiconductor material that differs from that of the strained semiconductor layer, wherein the electrically insulating layer is disposed directly between and in contact with each of the strained monocrystalline semiconductor layer and the at least partially relaxed layer of the same material as the strained semiconductor layer.

18. The substrate of claim 17, wherein a thickness of the electrically insulating layer is less than or equal to 50 nm, and a thickness of the at least partially relaxed layer of the same material as the strained semiconductor layer is between 1 nm and 20 nm.

19. The substrate of claim 18, wherein the thickness of the electrically insulating layer is less than or equal to 25 nm.

* * * * *

UNITED STATES PATENT AND TRADEMARK OFFICE
CERTIFICATE OF CORRECTION

PATENT NO.       : 10,672,646 B2
APPLICATION NO.  : 16/301260
DATED            : June 2, 2020
INVENTOR(S)      : Walter Schwarzenbach, Guillaume Chabanne and Nicolas Daval Page 1 of 1

It is certified that error appears in the above-identified patent and that said Letters Patent is hereby corrected as shown below:

In the Claims

Claim 13,   Column 10,   Lines 4 & 5,   change "comprises the detachment of" to --comprises detachment of--

Signed and Sealed this
First Day of September, 2020

Andrei Iancu
*Director of the United States Patent and Trademark Office*